US010775660B2

(12) United States Patent
Hara et al.

(10) Patent No.: US 10,775,660 B2
(45) Date of Patent: Sep. 15, 2020

(54) TOUCH-PANEL-EQUIPPED DISPLAY DEVICE AND METHOD FOR PRODUCING TOUCH-PANEL-EQUIPPED DISPLAY DEVICE

(71) Applicant: SHARP KABUSHIKI KAISHA, Sakai, Osaka (JP)

(72) Inventors: Yoshihito Hara, Sakai (JP); Masaki Maeda, Sakai (JP); Masakatsu Tominaga, Sakai (JP); Isao Ogasawara, Sakai (JP); Kuniko Maeno, Sakai (JP); Shingo Kamitani, Sakai (JP); Yasuhiro Mimura, Sakai (JP); Satoshi Horiuchi, Sakai (JP); Yoshihiro Asai, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 27 days.

(21) Appl. No.: 16/308,424

(22) PCT Filed: Jun. 7, 2017

(86) PCT No.: PCT/JP2017/021152
§ 371 (c)(1),
(2) Date: Dec. 7, 2018

(87) PCT Pub. No.: WO2017/213175
PCT Pub. Date: Dec. 14, 2017

(65) Prior Publication Data
US 2019/0265531 A1 Aug. 29, 2019

(30) Foreign Application Priority Data

Jun. 9, 2016 (JP) .................................. 2016-115573

(51) Int. Cl.
*G06F 3/045* (2006.01)
*G02F 1/1333* (2006.01)
(Continued)

(52) U.S. Cl.
CPC ........ *G02F 1/13338* (2013.01); *G02F 1/1333* (2013.01); *G02F 1/134336* (2013.01);
(Continued)

(58) Field of Classification Search
CPC ............... G02F 1/1333; G02F 1/13338; G02F 1/134336; G02F 1/13439; G02F 1/136227;
(Continued)

(56) References Cited

U.S. PATENT DOCUMENTS

| | | | |
|---|---|---|---|
| 2009/0059110 A1* | 3/2009 | Sasaki ............... | G02F 1/134363 349/39 |
| 2015/0177880 A1* | 6/2015 | Shin ...................... | G06F 3/0412 345/174 |
| 2015/0185938 A1 | 7/2015 | Han et al. | |

FOREIGN PATENT DOCUMENTS

| | | | |
|---|---|---|---|
| JP | 2009-058913 A | 3/2009 | |
| JP | 2013-178523 A | 9/2013 | |

(Continued)

*Primary Examiner* — Insa Sadio
(74) *Attorney, Agent, or Firm* — ScienBiziP, P.C.

(57) ABSTRACT

Provided is a touch-panel-equipped display device that can improve the touch sensing accuracy, without decreases in the display quality, and a method for producing the same. A touch-panel-equipped display device includes an active matrix substrate 1. The active matrix substrate 1 includes a plurality of pixel electrodes 31; a plurality of counter electrodes 21 forming capacitors between the same and the pixel electrodes 31; a plurality of touch detection lines 22; a first insulating layer 461; and a second insulating layer 462. The touch detection lines 22 are connected with any of the counter electrodes 21, and supply a driving signal for (Continued)

touch detection to the counter electrodes 21 connected therewith. Between each pixel electrode 31 and the corresponding one of the counter electrodes 21, the second insulating layer 462 is arranged. Further, on each touch detection line 22, the first insulating layer 461 is arranged, the second insulating layer 462 is arranged on the first insulating layer 461, and each counter electrode 21 is arranged on the second insulating layer 462.

7 Claims, 13 Drawing Sheets

(51) Int. Cl.
*G06F 3/041* (2006.01)
*G02F 1/1343* (2006.01)
*G02F 1/1362* (2006.01)
*G06F 3/044* (2006.01)
*H01L 27/12* (2006.01)
*G02F 1/1368* (2006.01)

(52) U.S. Cl.
CPC ........ *G02F 1/136286* (2013.01); *G06F 3/044* (2013.01); *G06F 3/0412* (2013.01); *G06F 3/0443* (2019.05); *G06F 3/04164* (2019.05); *G06F 3/04166* (2019.05); *H01L 27/124* (2013.01); *H01L 27/1259* (2013.01); *G02F 1/1368* (2013.01); *G02F 1/13439* (2013.01); *G02F 1/136227* (2013.01); *G02F 2001/136295* (2013.01); *G06F 2203/04103* (2013.01); *H01L 27/1225* (2013.01)

(58) Field of Classification Search
CPC ............. G02F 1/136286; G02F 1/1368; G02F 2001/136295; G06F 2203/04103; G06F 3/0412; G06F 3/04164; G06F 3/04166; G06F 3/044; G06F 3/0443; H01L 27/1225; H01L 27/124; H01L 27/1255; H01L 27/1259
See application file for complete search history.

(56) References Cited

FOREIGN PATENT DOCUMENTS

| | | |
|---|---|---|
| JP | 2015-122057 A | 7/2015 |
| JP | 2015-125776 A | 7/2015 |

* cited by examiner

F I G. 1
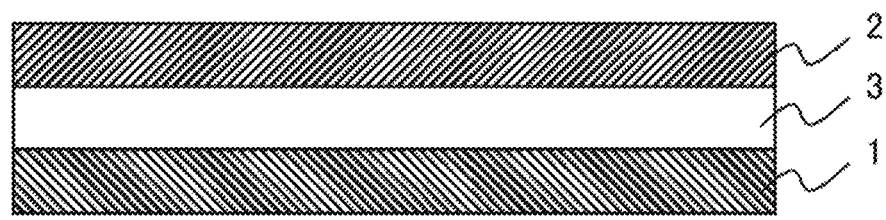

F I G. 5 E
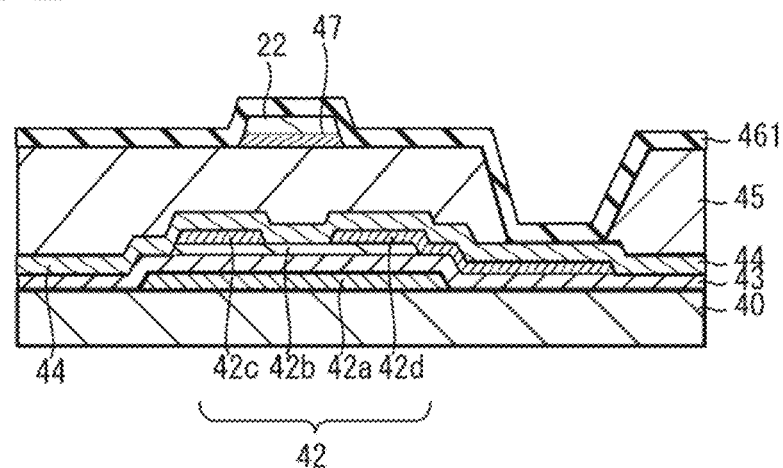
F I G. 5 F
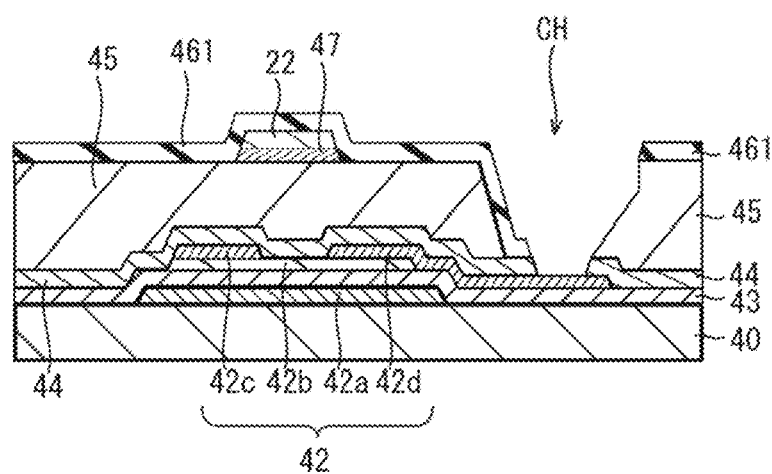
F I G. 5 G
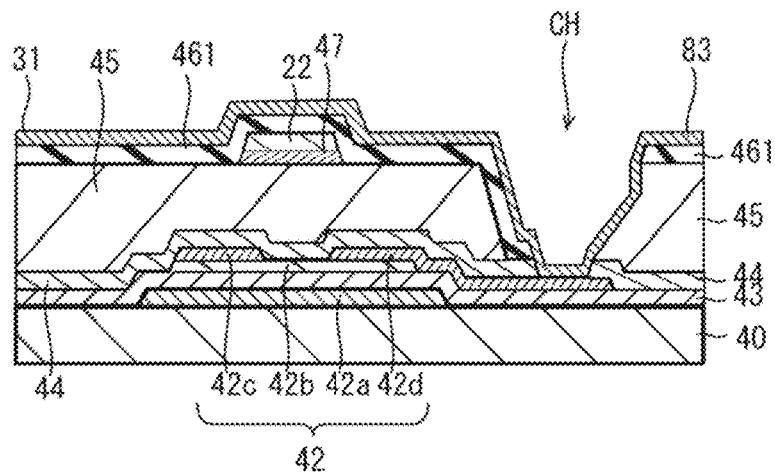

TOUCH-PANEL-EQUIPPED DISPLAY DEVICE AND METHOD FOR PRODUCING TOUCH-PANEL-EQUIPPED DISPLAY DEVICE

TECHNICAL FIELD

The present invention relates to a touch-panel-equipped display device, and a method for producing the same.

BACKGROUND ART

JP-A-2015-122057 discloses a touch screen pane integrated display device that includes a panel that serves as both of a display and a touch screen. On the panel, a plurality of pixels are formed, and each pixel is provided with a pixel electrode, and a transistor connected to the pixel electrode. Further, on the panel, a plurality of electrodes are arranged with spaces therebetween, so as to be opposed to the pixel electrodes. The plurality of electrodes function as common electrodes that form lateral electric fields (horizontal electric fields) between the same and the pixel electrodes in the display driving mode, and function as touch electrodes that form electrostatic capacitors between the same and a finger or the like in the touch driving mode. At least one signal line, approximately parallel with data lines, is connected to each of the plurality of electrodes, so that a touch driving signal or a common voltage signal is supplied thereto via the signal line. The pixel electrodes and the signal lines are formed in the same layer, and overlap with a plurality of electrodes, with one insulating layer being interposed therebetween.

SUMMARY OF THE INVENTION

Problem to be Solved by the Invention

In JP-A-2015-122057, the signal line, to which a common voltage signal or a touch driving signal is supplied, overlaps with not only electrodes connected with the signal lines, but also a part of the other electrodes, among the plurality of electrodes functioning as the common electrodes or the touch electrodes, with one insulating layer being interposed therebetween. Parasitic capacitances are therefore generated between the signal lines and a part of the other electrodes, thereby deteriorating touch detection accuracy. Then, if the thickness of the insulating layer provided between the electrodes and the signal lines is increased to reduce these parasitic capacitances, the capacitance between the same and the pixel electrode decreases, which degrades the display quality.

It is an object of the present invention to provide a touch-panel-equipped display device that can improve the touch sensing accuracy, without decreases in the display quality, and to provide a method for producing the same.

A touch-panel-equipped display device in one embodiment of the present invention includes an active matrix substrate, wherein the active matrix substrate includes: a plurality of gate lines; a plurality of data lines intersecting with the gate lines; a plurality of pixel electrodes; a plurality of counter electrodes that form capacitors between the same and the pixel electrodes; a plurality of touch detection lines that are connected with any of the counter electrodes, and supply a driving signal for touch detection to the counter electrodes connected therewith; a first insulating layer; and a second insulating layer, wherein the second insulating layer is arranged between each pixel electrode and the corresponding one of the counter electrodes, the first insulating layer is arranged on each touch detection line, the second insulating layer is arranged on the first insulating layer, and each counter electrode is arranged on the second insulating layer.

With the present invention, the touch sensing accuracy can be improved, without decreases in the display quality.

BRIEF DESCRIPTION OF DRAWINGS

FIG. 1 is a cross-sectional view illustrating a touch-panel-equipped display device in Embodiment 1.

FIG. 5E is a cross-sectional view illustrating a step of forming a first insulating film, subsequent to the state illustrated in FIG. 5D.

FIG. 5F is a cross-sectional view illustrating a step of forming an opening for connecting a pixel electrode and a drain electrode of a TFT, subsequent to the state illustrated in FIG. 5E.

FIG. 5G is a cross-sectional view illustrating a step of forming a transparent electrode film on the first insulating film illustrated in FIG. 5F.

MODE FOR CARRYING OUT THE INVENTION

Figure 2:
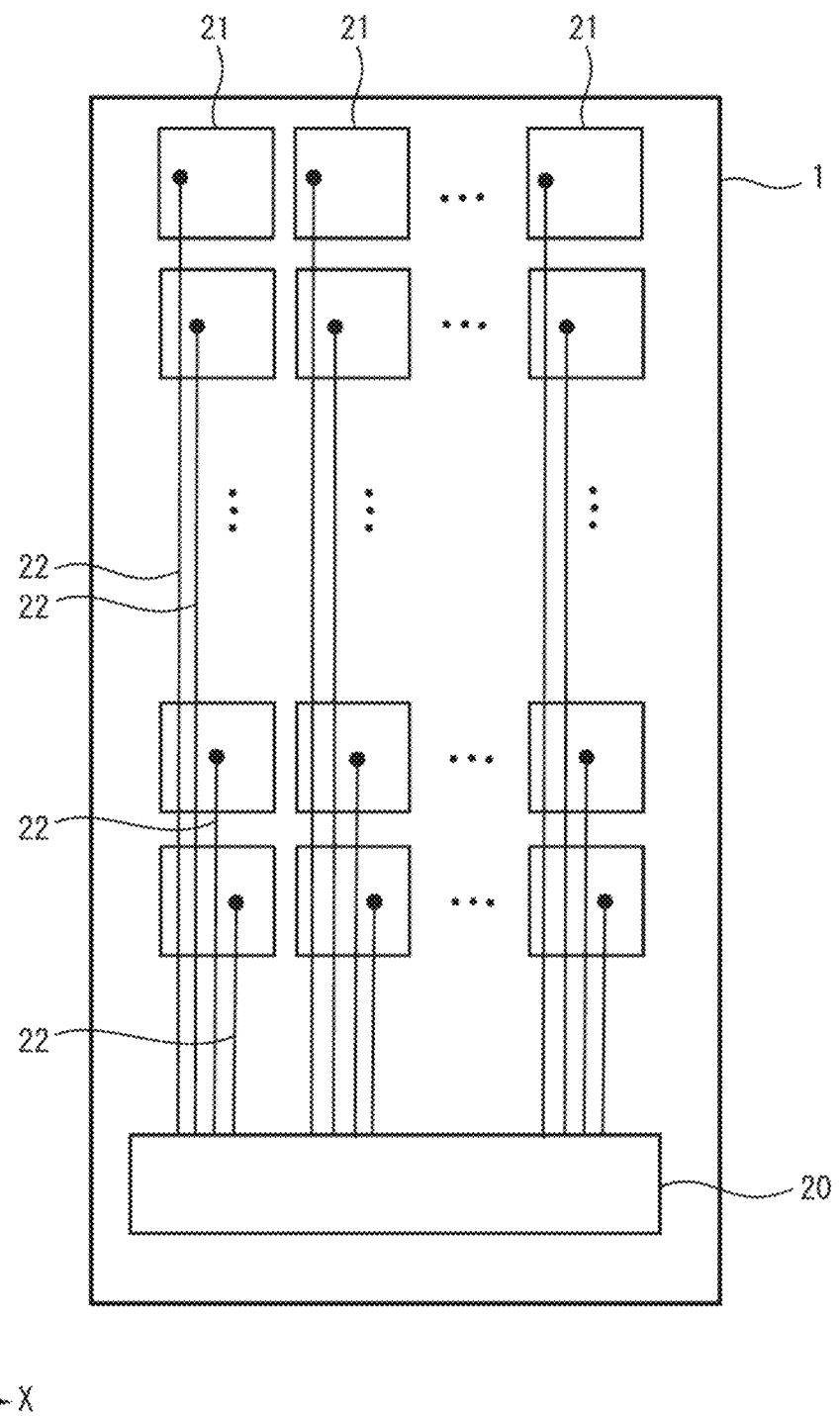
FIG. 2 schematically illustrates an exemplary arrangement of counter electrodes formed on the active matrix substrate illustrated in FIG. 1.

A touch-panel-equipped display device in one embodiment of the present invention includes an active matrix substrate, wherein the active matrix substrate includes: a plurality of gate lines; a plurality of data lines intersecting with the gate lines; a plurality of pixel electrodes; a plurality of counter electrodes that form capacitors between the same and the pixel electrodes; a plurality of touch detection lines that are connected with any of the counter electrodes, and supply a driving signal for touch detection to the counter electrodes connected therewith; a first insulating layer; and a second insulating layer, wherein the second insulating layer is arranged between each pixel electrode and the corresponding one of the counter electrodes, the first insulating layer is arranged on each touch detection line, the second insulating layer is arranged on the first insulating layer, and each counter electrode is arranged on the second insulating layer (the first configuration).

According to the first configuration, the second insulating layer is provided between the pixel electrode and the counter electrode. Further, the first insulating layer is arranged on the touch detection line, the second insulating layer is arranged on the first insulating layer, and the counter electrode is arranged on the second insulating layer. In other words, on the pixel electrode, one insulating layer is arranged, and on the touch detection line, two insulating layers are arranged. This makes it possible to reduce a parasitic capacitance between the touch detection line and the counter electrode, without decreases in the capacitance between the pixel electrode and the counter electrode. As a result, the touch sensing accuracy can be improved without decreases in the display quality.

The first configuration may be further characterized in that a specific dielectric constant of the first insulating layer and a specific dielectric constant of the second insulating layer are equal to each other, and the first insulating layer has a thickness greater than that of the second insulating layer (the second configuration).

According to the second configuration, in a case where a specific dielectric constant of the first insulating layer and that of the second insulating layer are equal to each other, the first insulating layer has a thickness greater than that of the second insulating layer. By doing so, the parasitic capacitance between the touch detection line and the counter electrode can be further reduced.

The first or second configuration may be further characterized in that the each pixel electrode is provided between the first insulating layer and the second insulating layer (the third configuration).

With the third configuration, the parasitic capacitance between the touch detection line and the counter electrode can be reduced, without decreases in the capacitance between the pixel electrode and the counter electrode.

The first or second configuration may be further characterized in that the active matrix substrate further includes: a plurality of auxiliary counter electrodes that form capacitors between the same and the pixel electrodes, wherein the counter electrodes are arranged in matrix, each auxiliary counter electrode is opposed to the corresponding one of the pixel electrodes with the first insulating layer being interposed therebetween, and is arranged approximately in parallel with the data lines (the fourth configuration).

According to the fourth configuration, while the counter electrodes are arranged so as to be arrayed in the direction in which the gate lines extend and in the direction in which the data lines extend, the auxiliary counter electrodes are arranged so as to be opposed to the pixel electrodes, approximately in parallel with the data lines. With this configuration, even in a case where amounts of fluctuations of the voltages are different among the counter electrodes arrayed in the data line extending direction, the differences of voltages applied to the respective pixels can be reduced with the capacitances generated between the pixel electrodes and the auxiliary counter electrodes.

The fourth configuration may be further characterized in that the driving signal is being supplied to the touch detection lines, the auxiliary counter electrodes are in an electrically floating state (the fifth configuration).

With the fifth configuration, touch position misdetections can be reduced.

The fourth or fifth configuration may be further characterized in that, to each of the gate lines, a scanning voltage signal is supplied at fixed intervals, and periods while the scanning voltage signal is supplied to adjacent ones of the gate lines partially overlap with each other (the sixth configuration).

With the sixth configuration, insufficient charging of the pixel can be reduced.

Any one of the first to sixth configurations may be further characterized in that the active matrix substrate further includes an insulating layer including an organic film, the insulating layer being arranged between at least either the gate lines or the data lines, and at least either the auxiliary capacitance electrodes or the counter electrodes (the seventh configuration).

With the seventh configuration, interference between the gate lines or the data lines and the auxiliary capacitance electrodes can be reduced.

The any one of the fourth to seventh configurations may be further characterized in that the auxiliary counter electrodes are provided so that each of the auxiliary counter electrodes is opposed to at least two of the counter electrodes (the eighth configuration).

With the eighth configuration, the pixel capacitances can be increased.

A method for producing a touch-panel-equipped display device in one embodiment of the present invention is a method for producing a touch-panel-equipped display device including an active matrix substrate, and the method includes the steps of: forming a switching element on the active matrix substrate; forming an insulating film so that the insulating film covers the switching element; forming a transparent conductive film on the insulating film, and forming a metal film on the transparent conductive film, so as to form a touch detection line; forming a first insulating layer so that the first insulating layer covers the touch detection line; forming a first contact hole that goes through the insulating film and the first insulating layer; forming a transparent conductive film for forming a pixel electrode on the first insulating layer, and forming the pixel electrode so that the pixel electrode is connected with the switching element in the first contact hole; forming a second insulating layer so that the second insulating layer covers the pixel electrode; forming a second contact hole that goes through the first insulating layer and the second insulating layer, in a part of an area on the touch detection line; and forming a transparent conductive film for forming a common electrode, on the second insulating layer, and forming a counter electrode so that the counter electrode is in contact with the touch detection line in the second contact hole (the ninth configuration).

According to the ninth configuration, the second insulating layer is provided between the pixel electrode and the counter electrode. Further, the first insulating layer is arranged on the touch detection line, the second insulating layer is arranged on the first insulating layer, and the counter electrode is arranged on the second insulating layer. In other words, on the pixel electrode, one insulating layer is arranged, and on the touch detection line, two insulating layers are arranged. This makes it possible to reduce a parasitic capacitance between the touch detection line and the counter electrode, without decreases in the capacitance between the pixel electrode and the counter electrode. Consequently, the touch sensing accuracy can be improved without decreases in the display quality.

Embodiment 1

FIG. 1 is a schematic cross-sectional view of a touch-panel-equipped display device 10 in the present embodiment. The touch-panel-equipped display device 10 in the present embodiment includes an active matrix substrate 1, a counter substrate 2, and a liquid crystal layer 3 interposed between the active matrix substrate 1 and the counter substrate 2. Each of the active matrix substrate 1 and the counter substrate 2 includes a glass substrate that is substantially transparent (having high translucency). The counter substrate 2 includes color filters that are not illustrated. Further, though the illustration is omitted, the touch-panel-equipped display device 10 includes a backlight that is provided so as to extend in a surface direction of the active matrix substrate 1 on a side opposite to the liquid crystal layer 3 in FIG. 1.

The touch-panel-equipped display device 10 has a function of displaying an image, and has a function of detecting a position that a user touches on the displayed image (touch position). This touch-panel-equipped display device 10 is a so-called in-cell type touch panel display device in which elements necessary for detecting a touch position are formed on the active matrix substrate 1.

In the case of the touch-panel-equipped display device 10, the method for driving liquid crystal molecules contained in the liquid crystal layer 3 is the horizontal electric field driving method. To realize the horizontal electric field driving method, the pixel electrodes and the counter electrodes (common electrodes) for forming electric fields are formed on the active matrix substrate 1.

FIG. 2 schematically illustrates an exemplary arrangement of the counter electrodes 21 formed on the active matrix substrate 1. The counter electrodes 21 are formed on a liquid crystal layer 3 side surface of the active matrix substrate 1. As illustrated in FIG. 2, the counter electrode 21 is in a rectangular shape, and a plurality of the counter electrodes 21 are arrayed in matrix on the active matrix substrate 1. Each counter electrode 21 is, for example, in an approximately square shape whose side is approximately several millimeters. Though the illustration is omitted in this drawing, slits (having a width of, for example, several micrometers) for causing horizontal electric fields to be generated between the counter electrodes 21 and the pixel electrodes are formed in the counter electrodes 21.

On the active matrix substrate 1, a controller 20 is provided. The controller 20 performs a controlling operation for displaying an image and a controlling operation for detecting a touch position.

The controller 20 and each counter electrode 21 are connected by signal lines 22 extending in the Y axis direction. More specifically, the same number of the signal lines 22 as the number of the counter electrodes 21 are formed on the active matrix substrate 1.

The counter electrodes 21 in pairs with the pixel electrodes are used during the controlling operation for displaying an image, and are also used during the controlling operation for detecting a touch position.

Regarding the counter electrodes 21, parasitic capacitances are formed between the same and adjacent ones of the counter electrodes 21 or the like. When a human finger or the like touches the display screen of the display device 10, capacitors are formed between the same and the human finger or the like, and electrostatic capacitances increase. During the control for touch position detection, the controller 20 supplies a touch driving signal to the counter electrodes 21 through the signal lines 22, and receives a touch detection signal through the signal lines 22. By doing so, the controller 20 detects changes in the electrostatic capacitances at the positions of the counter electrodes 21, and detects a touch position. In other words, the signal lines 22 function as lines for the transmission/reception of the touch driving signal and the touch detection signal.

Figure 3:
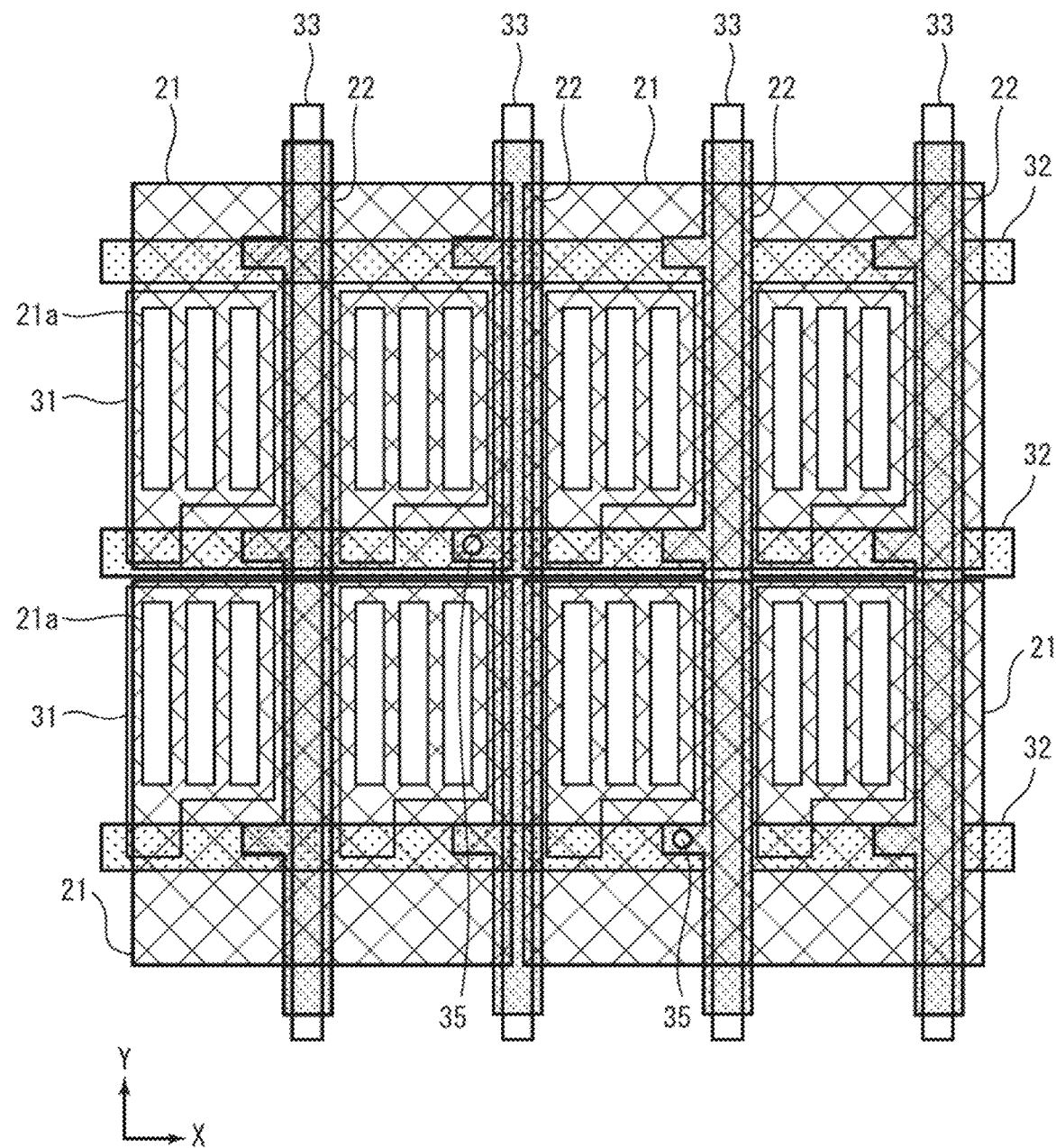
FIG. 3 is an enlarged view schematically illustrating a partial area of the active matrix substrate illustrated in FIG. 1.

FIG. 3 is an enlarged schematic diagram illustrating a part of the area of the active matrix substrate 1. As illustrated in FIG. 3, a plurality of pixel electrodes 31 are arranged in matrix. Further, though the illustration is omitted in FIG. 3, thin film transistors (TFTs) as display control elements (switching elements) are also arranged in matrix in correspondence to the pixel electrodes 31, respectively. The counter electrodes 21 are provided with a plurality of slits 21a.

Around the pixel electrodes 31, the gate lines 32 and the source lines 33 are provided. The gate line 32 extends in the X axis direction, and a plurality of the same are arrayed at predetermined intervals in the Y axis direction. The source line 33 extends in the Y axis direction, and a plurality of the same are arrayed at predetermined intervals in the X axis direction. In other words, the gate lines 32 and the source lines 33 are formed in a lattice form, and the pixel electrodes 31 are provided in the areas defined by the gate lines 32 and the source lines 33, respectively. The gate electrode of each TFT described above is connected with the gate line 32, either the source electrode or the drain electrode thereof is connected with the source line 33, and the other one is connected with the pixel electrode 31.

On the counter substrate 2 (see FIG. 1), color filter of three colors of R, G, and B are provided so as to correspond to the pixel electrodes 31, respectively. With this configuration, each of the pixel electrodes 31 functions as a subpixel of any one of the colors of R, G, and B.

As illustrated in FIG. 3, the signal lines 22 extending in the Y axis direction are arranged so as to partially overlap, in the normal line direction of the active matrix substrate 1, with the source lines 33 extending in the Y axis direction. More specifically, the signal lines 22 are provided in a layer upper with respect to the source lines 33, and the signal lines 22 and the source lines 33 partially overlap with each other when viewed in a plan view.

In FIG. 3, white circles 35 indicate portions at which the counter electrodes 21 and the signal line 22 are connected with each other.

Figure 4:
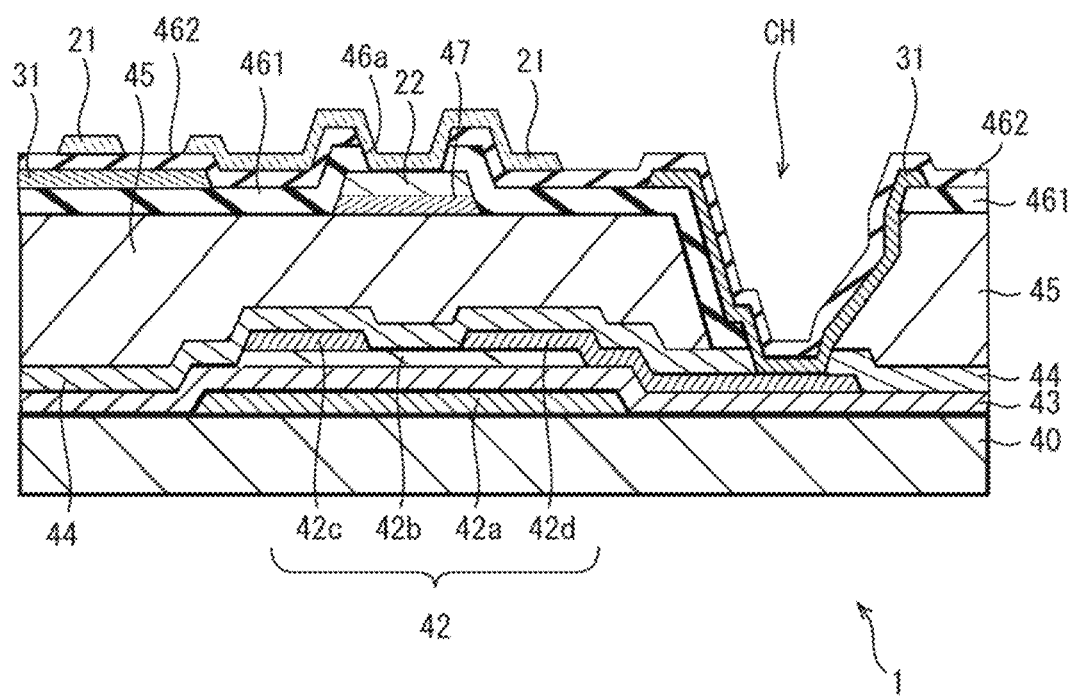
FIG. 4 is a schematic cross-sectional view of the active matrix substrate in a signal line connection area.

FIG. 4 is a cross-sectional view of the active matrix substrate 1, in an area thereof where the TFT is arranged, and the signal line 22 is connected with the counter electrode 21 (this area is hereinafter referred to as a "signal line connection area"). As illustrated in FIG. 4, a TFT 42 as a display control element is provided on a glass substrate 40. The TFT 42 includes a gate electrode 42a, a semiconductor film 42b, a source electrode 42c, and a drain electrode 42d.

The gate electrode 42a of the TFT 42 is formed on the glass substrate 40. The gate electrode 42a is formed with, for example, a laminate film of titanium (Ti) and copper (Cu). The gate insulating film 43 is formed so as to cover the gate electrode 42a. The gate insulating film 43 is formed with, for example, silicon nitride (SiNx), silicon dioxide (SiO$_2$), or the like.

On the gate insulating film 43, a semiconductor film 42b is formed. The semiconductor film 42b is, for example, an oxide semiconductor film, and may contain at least one metal element among In, Ga, and Zn. In the present embodiment, the semiconductor film 42b contains, for example, In—Ga—Zn—O-based semiconductor. Here, the In—Ga—Zn—O-based semiconductor is a ternary oxide of indium (In), gallium (Ga), and zinc (Zn), in which the ratio (composition ratio) of In, Ga, and Zn is not limited particularly, and examples of the ratio include In:Ga:Zn=2:2:1, In:Ga:Zn=1:1:1, and In:Ga:Zn=1:1:2.

The source electrode 42c and the drain electrode 42d are provided on the semiconductor film 42b so as to be positioned apart from each other. The source electrode 42c and the drain electrode 42d are formed with, for example, laminate films made of titanium (Ti) and copper (Cu).

An inorganic insulating film 44 is formed so as to cover the source electrode 42c and the drain electrode 42d. The inorganic insulating film 44 is made of an inorganic material, for example, silicon nitride (SiN$_x$) or silicon dioxide (SiO$_2$).

On the inorganic insulating film 44, an organic insulating film (flattening film) 45 is formed. The organic insulating film 45 is made of, for example, an acryl-based organic resin material such as polymethyl methacrylate resin (PMMA). By forming the organic insulating film (flattening film) 45, disturbance of the alignment of liquid crystal molecules caused by unevenness in TFT portions can be reduced. Further, parasitic capacitances between the gate lines 32 or the source lines 33 and the pixel electrodes 31 can be reduced. The organic insulating film 45, however, can be omitted.

On the organic insulating film 45, a conductive film 47 and signal lines 22 are formed so as to be laminated. The conductive film 47 is a transparent electrode film made of the same material as that of the pixel electrodes 31, and is provided for the purpose of improving the adhesiveness between the signal line 22 and the organic insulating film 45. In a case where the adhesiveness between the signal line 22 and the organic insulating film 45 is high, the conductive film 47 can be omitted.

The signal lines 22 are made of, for example, any one of copper (Cu), titanium (Ti), molybdenum (Mo), aluminum (Al), magnesium (Mg), cobalt (Co), chromium (Cr), tungsten (ON), or a mixture of these. As a material for the signal lines 22, a material having a smaller specific resistance than that of the conductive film 47 is particularly preferable. In a case where the conductive film 47 is omitted, the signal lines 22 are formed on the organic insulating film 45.

Further, on the organic insulating film 45, a first insulating film 461 (a first insulating layer) is formed. The first insulating film 461 is formed so as to cover a part of the signal lines 22. The first insulating film 461 is made of, for example, silicon nitride (SiNx), or silicon dioxide (SiO$_2$).

On the first insulating film 461, the pixel electrodes 31 are formed at a position that does not overlap with the signal lines 22. The pixel electrode 31 is a transparent electrode made of a material such as indium tin oxide (ITO), zinc oxide (ZnO), indium zinc oxide (IZO), indium gallium zinc oxide (IGZO), indium tin zinc oxide (ITZO), or the like.

Still further, on the first insulating film 461 and the pixel electrodes 31, a second insulating film 462 (second insulating layer) is formed. The second insulating film 462 is made of, for example, silicon nitride (SiNx), silicon dioxide (SiO$_2$), or the like. In the signal line connection area, as illustrated in the drawing, an opening (second contact hole) 46a is formed in the first insulating film 461 and the second insulating film 462; the opening 46a, however, is not provided in any area where the signal line 22 and the counter electrode 21 are not connected. In other words, in a portion where the signal line 22 is not connected with the counter electrode 21 and overlaps with another counter electrode 21, two insulating films, i.e., the first insulating film 461 and the second insulating film 462, are provided between the another counter electrode 21 and the signal line 22.

On the second insulating film 462, the counter electrodes 21 are formed. The counter electrode 21 is in contact with the signal line 22 in the opening 46a. The counter electrode 21 is a transparent electrode made of a material such as ITO, ZnO, IZO, IGZO, ITZO, or the like.

An opening (first contact hole) OH is formed in the inorganic insulating film 44 and the organic insulating film 45. The pixel electrode 31 is in contact with the drain electrode 42d of the TFT 42 through the opening OH.

FIGS. 5A to 5L are diagrams for explaining a process for producing the active matrix substrate 1 in the present embodiment.

Figure 5A:
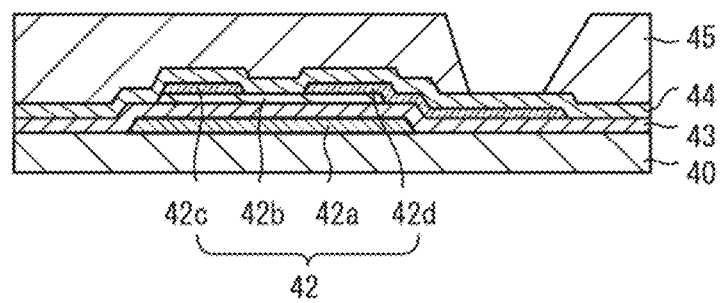
FIG. 5A is a cross-sectional view for explaining a method for producing the active matrix substrate illustrated in FIG. 1, the view illustrating a state in which a TFT, an inorganic insulating film, and an organic insulating film are formed.

First, on the glass substrate 40, the TFT 42 is formed by a known method. FIG. 5A illustrates a state in which the TFT 42 is formed on the glass substrate 40 by a known method, and the inorganic insulating film 44 and the organic insulating film 45 are formed thereon.

Figure 5B:
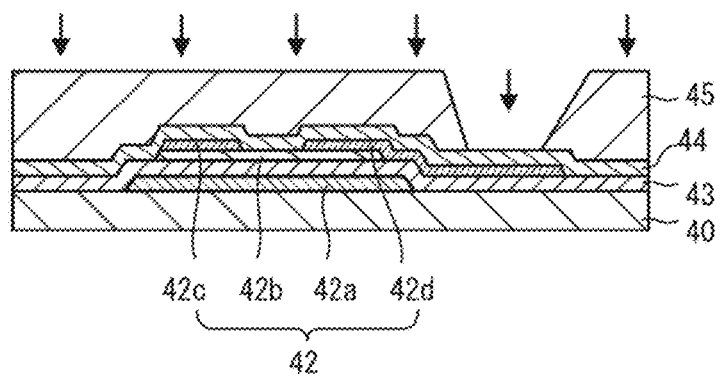
FIG. 5B is a cross-sectional view illustrating a step of performing a plasma treatment with respect to a surface of the active matrix substrate illustrated in FIG. 5A.

In the state illustrated in FIG. 5A, a plasma treatment using nitrogen gas or oxygen gas is performed with respect to an exposed surface (see FIG. 5B). In other words, a plasma treatment is performed with respect to exposed surfaces of the inorganic insulating film 44 and the organic insulating film 45. By performing the plasma treatment, fine unevenness can be formed on a smooth surface (surface roughening), thereby causing the adhesiveness of a transparent electrode film to be formed in a later step to be improved.

Figure 5C:
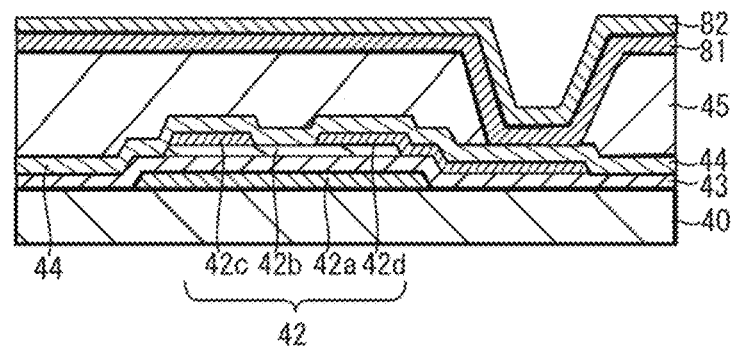
FIG. 5C is a cross-sectional view illustrating a step of forming a transparent electrode film and a metal film on the organic insulating film illustrated in FIG. 5B.
Figure 5D:
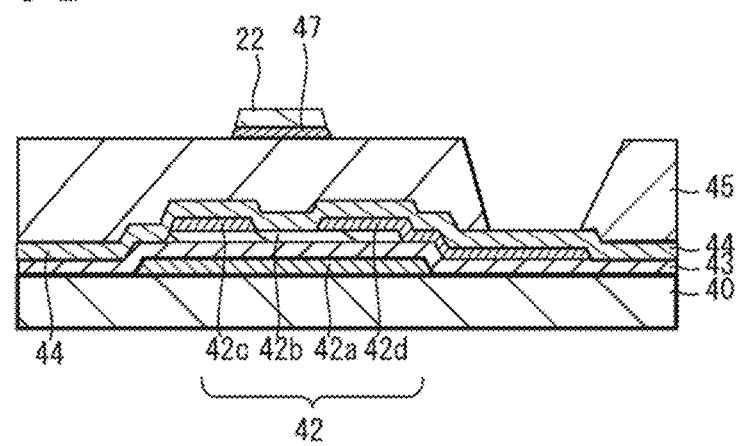
FIG. 5D is a cross-sectional view illustrating a step of forming a conductive film and a signal line, subsequent to the state illustrated FIG. 5C.
Figure 5H:
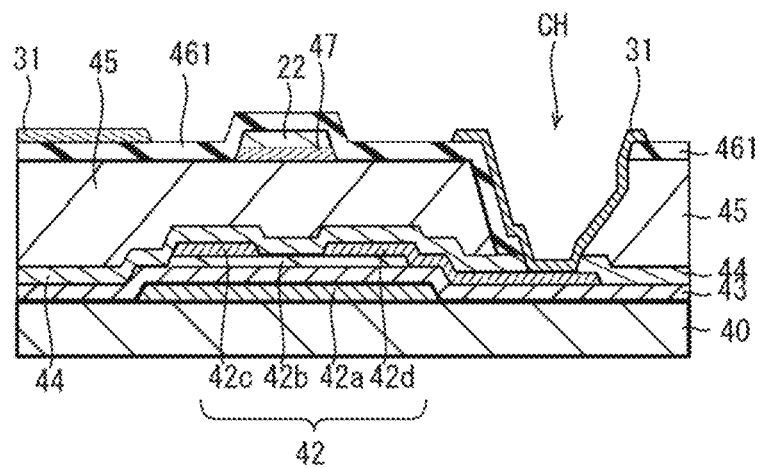
FIG. 5H is a cross-sectional view illustrating a step of forming a pixel electrode connected with the drain electrode, subsequent to the state illustrated in FIG. 5G.

Subsequently, a transparent electrode film 81 is formed on the organic insulating film 45, and a metal film 82 is formed thereon (see FIG. 5C). The transparent electrode film 81 has a thickness of, for example, 10 nm to 100 nm. Further, the metal film 82 has a thickness of, for example, 50 nm to 300 nm. Then, the transparent electrode film 81 and the metal film 82 are patterned by using photolithography and wet etching. Thereby, the signal line 22 and the conductive film 47 are formed (see FIG. 5D).

Next, a first insulating film 461 is formed so as to cover the inorganic film 44, the organic insulating film 45, and the metal film 82 (see FIG. 5E). The first insulating film 461 has a thickness of, for example, 200 nm to 800 nm.

Subsequently, parts of the first insulating film 461 and the inorganic insulating film 44 that overlap with the drain electrode 42d of the TFT 42 are patterned by using photolithography and dry etching. This causes a part of the surface of the drain electrode 42d to be exposed, whereby an opening CH for connecting the pixel electrode 31 and the drain electrode 42d of the TFT 42 is formed (see FIG. 5F).

Next, a transparent electrode film 83 is formed so as to cover the first insulating film 461 (see FIG. 5G). Thereafter, the transparent electrode film 83 is patterned by using photolithography and wet etching. As a result, the pixel electrode 31 that is connected with the drain electrode 42d at the opening CH is formed (see FIG. 5H).

Figure 5I:
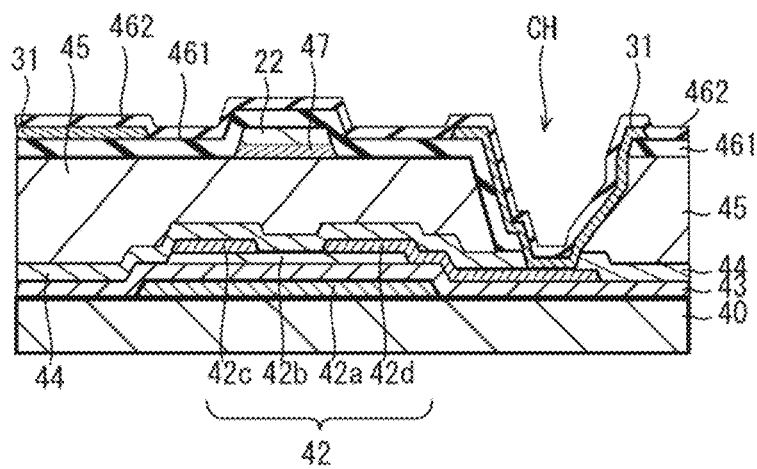
FIG. 5I is a cross-sectional view illustrating a step of forming a second insulating film on the pixel electrode and the first insulating film illustrated in FIG. 5H.
Figure 5J:
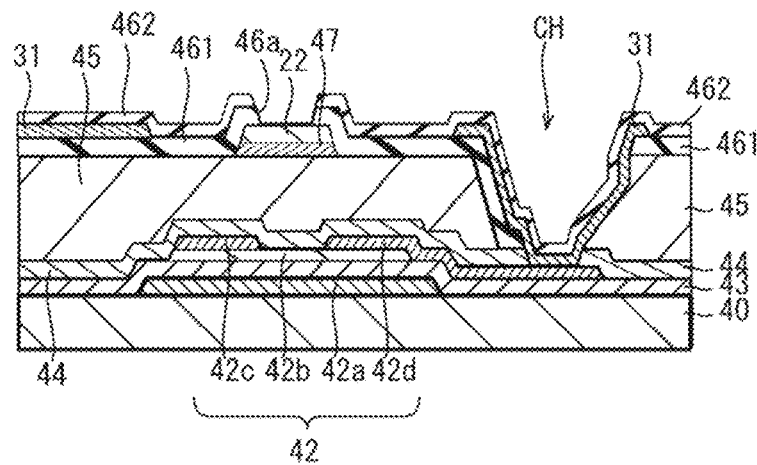
FIG. 5J is a cross-sectional view illustrating a step of forming an opening in the first insulating film and the second insulating film illustrated in FIG. 5I.

Subsequently, a second insulating film 462 is formed so as to cover the pixel electrode 31 and the first insulating film 461 (see FIG. 5I). The second insulating film 462 has a thickness of, for example, 200 nm to 800 nm. In this example, the first insulating film 461 and the second insulating film 462 have the same specific dielectric constant, and the second insulating film 462 has a smaller thickness than that of the first insulating film 461. Though the first insulating film 461 and the second insulating film 462 have the same specific dielectric constant in this example, the specific dielectric constants thereof do not have to be the same; the first insulating film 461 and the second insulating film 462 may have specific dielectric constants that are substantially equal to each other.

After the second insulating film 462 is formed, the first insulating film 461 and the second insulating film 462 are patterned by using photolithography and dry etching, whereby a part of the signal line 22 is exposed. As a result, an opening 46a is formed in the first insulating film 461 and the second insulating film 462, whereby a part of the surface of the signal line 22 is exposed (see FIG. 5J).

Figure 5K:
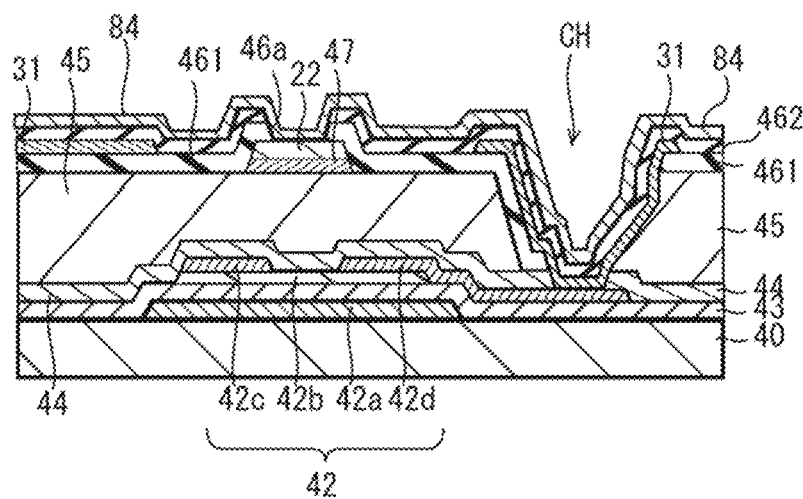
FIG. 5K is a cross-sectional view illustrating a step of forming a transparent electrode film on the second insulating film illustrated in FIG. 5J.
Figure 5L:
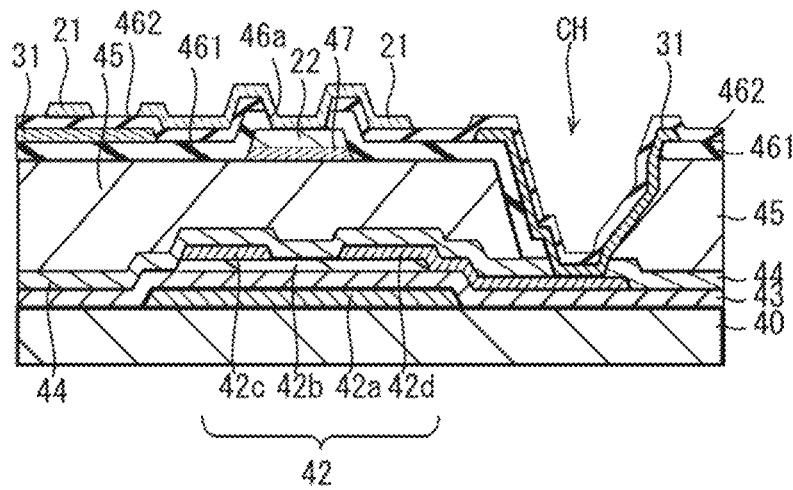
FIG. 5L is a cross-sectional view illustrating a step of forming a counter electrode, subsequent to the state illustrated in FIG. 5K.

Next, on the second insulating film 462, the transparent electrode film 84 is formed so as to be in contact with the signal line 22 (see FIG. 5K). Then, the transparent electrode film 84 is patterned by using photolithography and wet etching. As a result, the counter electrode 21 having slits that allow horizontal electric fields to be generated between the counter electrodes 21 and the pixel electrodes 31 is formed (see FIG. 5L).

In Embodiment 1, the first insulating film 461 and the second insulating film 462 are provided between the signal lines 22 and the counter electrodes 21. The parasitic capacitances can be therefore reduced in areas where some signal lines 22 that are not connected with the counter electrodes 21 overlap with the counter electrodes 21, as compared with a case where only one insulating film is provided between the signal line 22 and the counter electrode 21. In addition, the signal lines 22 and the pixel electrodes 31 are provided in different layers, and only one second insulating film 462 is provided between the pixel electrodes 31 and the counter electrodes 21. The pixel capacitances (auxiliary capacitances) are therefore large as compared with a case where the first insulating film 461 and the second insulating film 462 are provided between the signal lines 22 and the counter electrodes 21, and the signal lines 22 and the pixel electrodes 31 are provided in the same layer. As a result, the touch position detection accuracy can be improved without decreases in the image display quality.

Still further, in Embodiment 1 described above, the first insulating film 461 and the second insulating film 462 have approximately equal specific dielectric constants, and the first insulating film 461 has a thickness greater than the thickness of the second insulating film 462. In a case where the first insulating film 461 and the second insulating film 462 have equal specific dielectric constants, parasitic capacitances generated between the signal lines 22 and the counter electrodes 21 can be reduced, without decreasing the pixel capacitances (auxiliary capacitances), as compared with a configuration in which the first insulating film 461 and the second insulating film 462 have equal thicknesses. Consequently, the touch position detection accuracy can be further improved.

Embodiment 2

Figure 6:
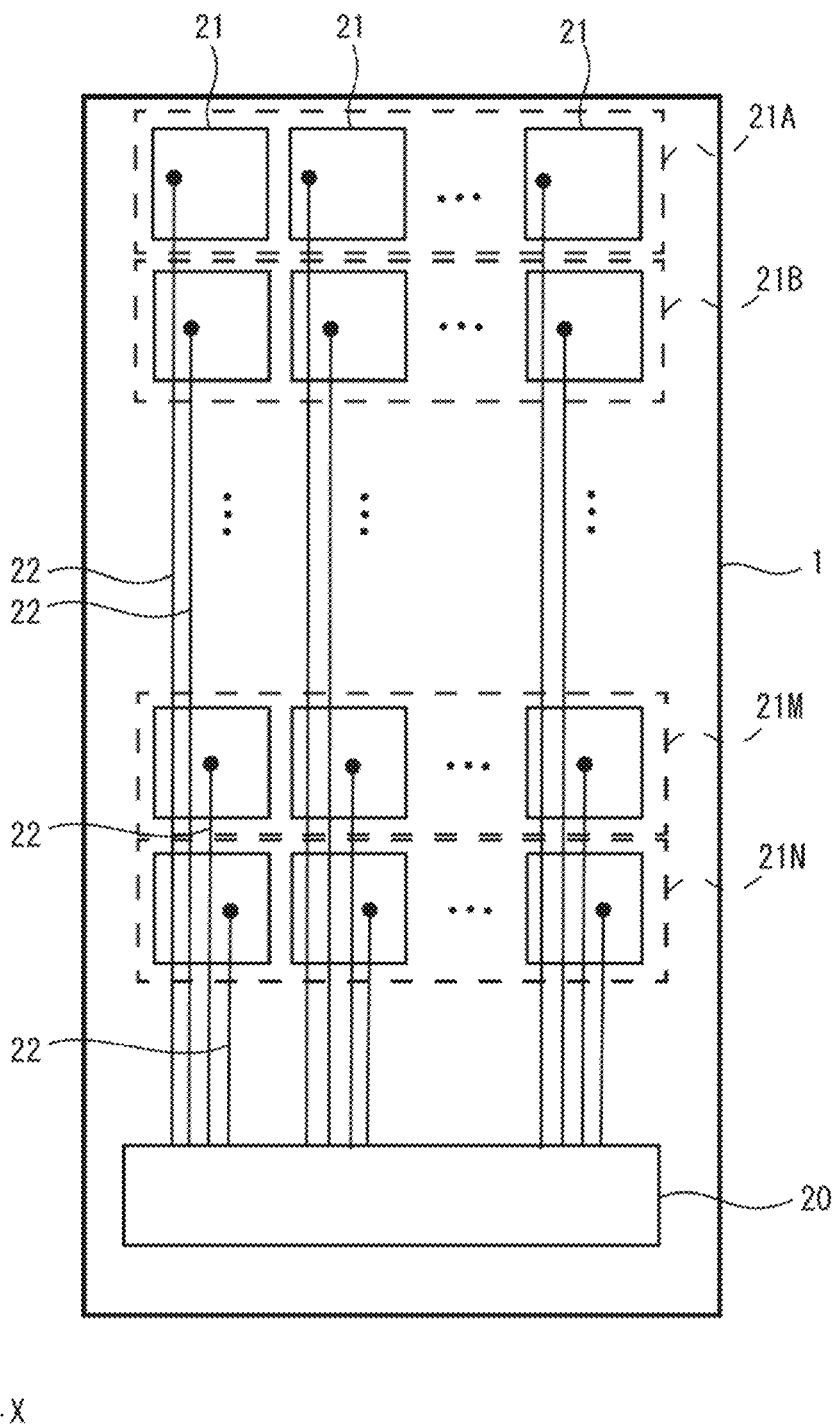
FIG. 6 is a schematic plan view illustrating an arrangement of the counter electrodes in the active matrix substrate.

In Embodiment 1, as illustrated in FIG. 6, the counter electrodes 21 are arranged in matrix on the active matrix substrate 1; in other words, they are arrayed in the direction in which the gate lines 32 extend and the direction in the source lines 33 extend, which are illustrated in FIG. 3. In FIG. 6, areas of respective rows in which the counter electrodes 21 are arrayed are assumed to be "segments 21A to 21N".

The counter electrodes 21 are arranged so as to be divided into the segments. When a signal is written in a certain pixel (the TFT of the pixels is turned ON so that the pixel capacitor is charged), influences received from a pixel adjacent thereto in the Y axis direction is different between the vicinities of boundaries of the segment and the center part of the segment in some cases, in which voltages applies to the liquid crystal layer 3 are different. The following description describes this phenomenon in detail.

For example, in some cases, in order to make up for the insufficient charging for each pixel, a preliminary charging (hereinafter referred to as pre-charging) period is provided before a regular charging (hereinafter referred to as main charging) period.

Figure 7A:
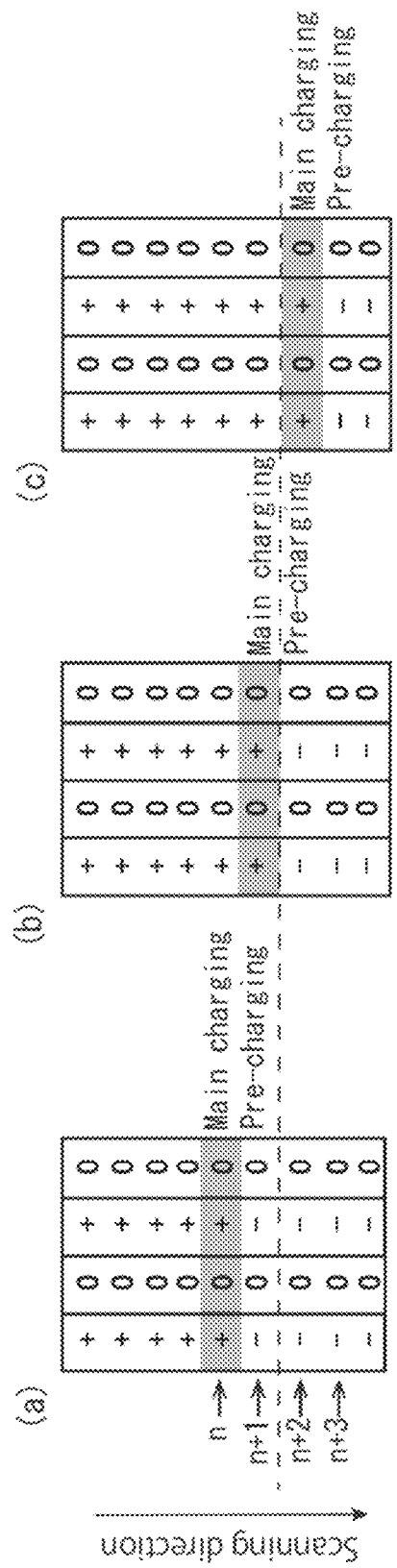
FIG. 7A is a diagram for explaining a cause for luminance difference occurring to pixels at a boundary of segments in Embodiment 2, illustrating transition of charging states at respective pixels.

(a) to (c) of FIG. 7A are transition diagrams illustrating charging states of each pixel in a case where column reverse driving is performed. "+", "−", and "0" in (a) to (c) of FIG. 7A indicate charging voltages (polarities or voltage values) of the pixel. Further, in this example, as illustrated in (a) to (c) in FIG. 7A, the gate lines 32 of the pixels (see FIG. 3) are scanned in a direction from the top to the bottom of the drawing, and the main charging period for each pixel overlaps with the pre-charging period for the pixel adjacent thereto in the scanning direction. Still further, the boundary between the pixels in the (n+1)th row and the pixels in the (n+2)th row is a boundary between segments of the counter electrodes 21. In other words, the counter electrodes 21 of the same segment are arranged in correspondence to the pixels in the n'th row and the (n+1)th row, and the counter electrodes 21 of a segment different from the above-described segment are arranged in correspondence to the pixels in the (n+2)th row and the (n+3)th row.

Figure 7B:
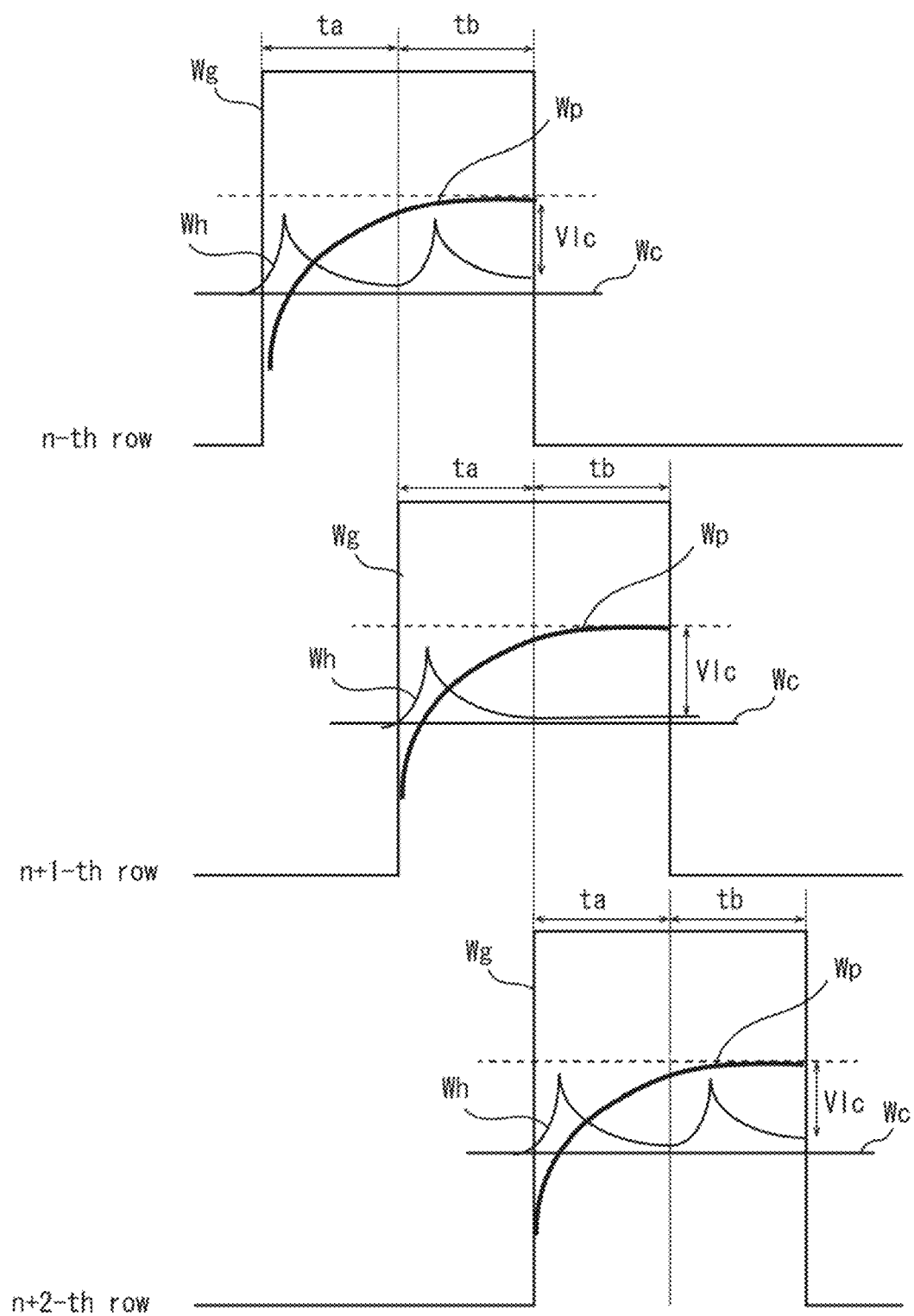
FIG. 7B illustrates voltage waveforms when the pixels illustrated in FIG. 7A are charged.

Further, FIG. 7B illustrates voltage waveforms when the pixels in the n'th row, the (n+1)th row, and the (n+2)th row illustrated in (a) to (c) of FIG. 7A are charged. In FIG. 7B, the waveform denoted by "Wg" is a voltage waveform of the gate line 32, the waveform denoted by "Wc" is an ideal voltage waveform of the counter electrode 21. Further, the waveform denoted by "Wh" is an actual voltage waveform of the counter electrode 21, and the waveform denoted by "Wp" is a voltage waveform of the pixel.

As illustrated in FIG. 7B, the voltage waveform Wh of the counter electrode 21 in the n'th row is affected by the pre-charging of the pixel in the n'th row, and is deviated from the ideal voltage waveform Wc of the counter electrode 21. More specifically, it rises once, then, falls again in such a manner that it approaches to the ideal voltage waveform Wc of the counter electrode 21. As illustrated in (a) of FIG. 7A, since the main charging period for the pixels in the n'th row and the pre-charging period for the pixels in the (n+1)th row overlap, the pre-charging period to for the pixels in the (n+1)th row starts simultaneously with the main charging period tb for the pixels in the n'th row. Since the same counter electrodes 21 commonly correspond to the pixels in the n'th row and the pixels in the (n+1)th row, the voltage waveform Wh of the counter electrodes 21 of the n'th row rises again, affected by fluctuations of the potentials of the counter electrodes 21 due to the pre-charging of the pixels in the (n+1)th row, and then, falls again in such a manner that it approaches to the ideal voltage waveform Wc of the counter electrodes 21. The voltage applied to the liquid crystal layer 3 when the main charging period tb ends is assumed to be "Vlc".

The voltage waveform Wh of the counter electrodes 21 in the (n+1)th row is affected by pre-charging of the pixels in the (n+1)th row, thereby being deviated from the ideal voltage waveform Wc of the counter electrodes 21. More specifically, it rises once, then, falls again in such a manner that it approaches to the ideal voltage waveform Wc of the counter electrode 21. As illustrated in (b) of FIG. 7A, since the main charging period for the pixels in the (n+1)th row and the pre-charging period for the pixels in the (n+2)th row overlap, the pre-charging period to for the pixels in the (n+2)th row starts simultaneously with the main charging period tb for the pixels in the (n+1)th row. Here, the voltage waveform Wh of the counter electrodes 21 in the (n+1)th row is not affected by the pre-charging of the pixels in the (n+2)th row. The counter electrodes 21 corresponding to the pixels in the (n+1)th row, and the counter electrodes 21 corresponding to the pixels in the (n+2)th row are arranged in different segments, respectively, and are separated from each other. The pixels in the counter electrodes 21 in the (n+1)th row, therefore, do not have potential fluctuations due to pre-charging of the pixels in the (n+2)th row. In other words, as described above, during the pre-charging period for the (n+1)th row, the voltage waveform Wh of the counter electrode 21, which once rises, falls again in such a manner that it approaches to the ideal voltage waveform Wc of the counter electrodes 21. The main charging period for the (n+1)th row is allocated for the period while the voltage waveform Wh of the counter electrode 21 approaches the ideal voltage waveform Wc of the counter electrode 21. The voltage waveform Wh of the counter electrode 21 when the main charging period tb for the (n+1)th row ends is therefore different in some cases from the voltage Wh of the counter electrode 21 when the main charging period tb for the n'th row ends. In this case, the voltage Vlc applied to the liquid crystal layer 3 when the main charging period tb for the pixels in the (n+1)th row ends is greater than the voltage Vlc applied to the liquid crystal layer 3 corresponding to the pixels in the n'th row.

Likewise, as illustrated in (c) of FIG. 7A, the main charging period for the pixels in the (n+2)th row, and the pre-charging period for the pixels in the (n+3)th row overlap, and the same counter electrodes 21 are commonly arranged in correspondence to the pixels in the (n+2)th row and the (n+3)th row. The pixels in the (n+2)th row, therefore, are affected by the pre-charging of the pixels in the (n+3)th row during the main charging period tb for the pixels in the (n+2)th row. In other words, the voltage waveform Wh of the counter electrodes 21 corresponding to the pixels in the (n+2)th row rises, and as is the case with the pixels in the n'th row, the voltage of the pixels applied to the liquid crystal layer 3 decreases. In this example, therefore, luminance difference occurs to between the pixels in the n'th row and the pixels in the (n+1)th row, as well as between the pixels in the (n+1)th row and the pixels in the (n+2)th row.

In other words, in the pixels that are adjacent in the scanning direction and to which the same counter electrodes 21 are commonly arranged, the pixels that are subjected to main charging earlier are affected, during this main charging, by pre-charging for the other pixels, and the voltages applied to the liquid crystal layer 3 decrease. On the other hand, in a case of the pixels that correspond to different counter electrodes 21 even though being adjacent in the scanning direction, the pixels that are subjected to main charging earlier are not affected, during this main charging, by pre-charging for the other pixels. Consequently, luminance differences occur to between the pixels in the vicinities of the boundaries between the segments. The following description describes a configuration of the active matrix substrate in the present embodiment that makes it possible to further reduce luminance differences in the pixels in the vicinities of the boundaries between the segments, as compared with Embodiment 1.

Figure 8:
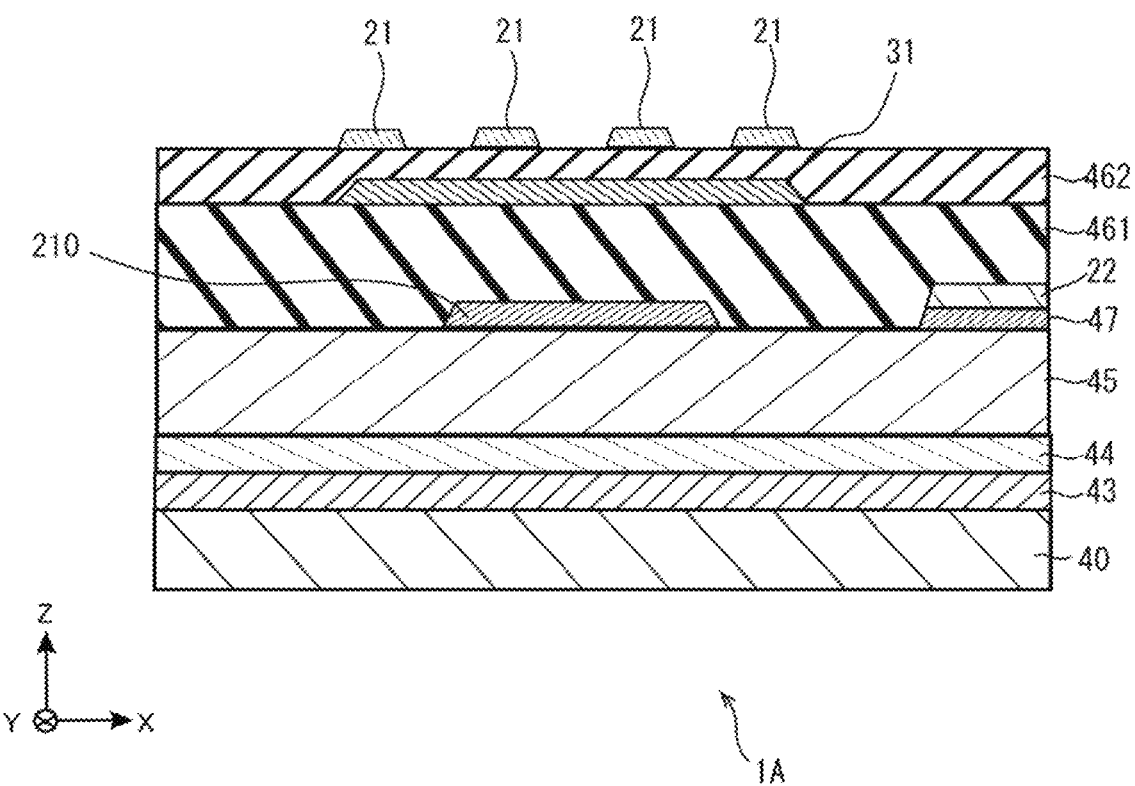
FIG. 8 is a schematic cross-sectional view illustrating an area where the pixel electrodes are arranged on the active matrix substrate in Embodiment 2.

FIG. 8 is a schematic cross-sectional view of an area of an active matrix substrate where pixel electrodes are arranged in the present embodiment. In FIG. 8, the same constituent members as those in Embodiment 1 are denoted by the same reference symbols as those in Embodiment 1. The following description mainly describe configurations different from those of Embodiment 1.

As illustrated in FIG. 8, an active matrix substrate 1A includes electrodes 210 formed with the same material as that of the conductive film 47, so that the electrodes 210 are opposed to the pixel electrodes 31 with the first insulating film 461 being interposed therebetween. Hereinafter the electrodes 210 are referred to as "auxiliary counter electrodes.

The auxiliary counter electrodes 210 are formed so as to extend in the Y axis direction. More specifically, the auxiliary counter electrodes 210 are arranged continuously over the segments 21A to 21N. The auxiliary counter electrode 210 is not connected with the signal line 22, but under the control by the controller 20, a predetermined voltage is applied thereto during the controlling operation for displaying an image, and a capacitor is formed between the auxiliary counter electrode 210 and the pixel electrode 31. Further, during the controlling operation for detecting a touch position, the auxiliary counter electrode 210 is controlled so as to be in an electrically floating state. As the auxiliary counter electrode 210 is in a floating state during the controlling operation for detecting a touch position, charges are held between the pixel electrode 31 and the auxiliary counter electrode 210.

Even if the auxiliary counter electrode 210 is provided, it therefore does not become a cause of malfunctions during the controlling operation for detecting a touch position, and with the charges held between the auxiliary counter electrode 210 and the pixel electrode 31, the difference between voltages applied to the liquid crystal layer 3, which occurs due to fluctuations of the voltages of the counter electrodes 21 between adjacent ones of the segments, can be reduced. Consequently, luminance differences in the pixels in the vicinities of boundaries between adjacent segments can be reduced.

Figure 9A:
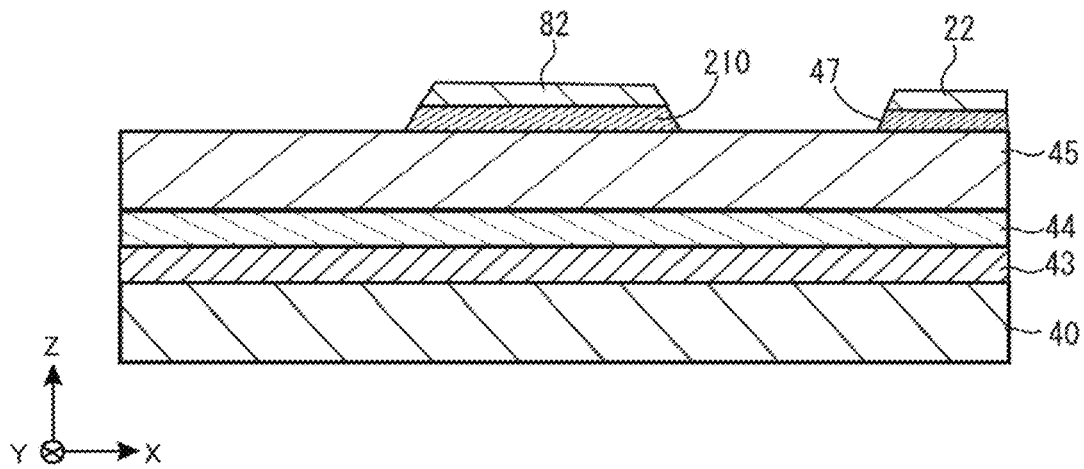
FIG. 9A is a cross-sectional view illustrating a step of forming an auxiliary counter electrode and a conductive film on the active matrix substrate illustrated in FIG. 8.

The method for producing the active matrix substrate in the present embodiment includes a step of forming a transparent electrode film 81 and a metal film 82 on the organic insulating film 45, and patterning the transparent electrode film 81 and the metal film 82 by using photolithography and wet etching, after the steps illustrated in FIGS. 5A to 5B in Embodiment 1 described above. Through this step, the auxiliary counter electrodes 210 and the conductive film 47 made of the transparent electrode film 81, and the signal lines 22 made of the metal film 82, are formed (see FIG. 9A).

Figure 9B:
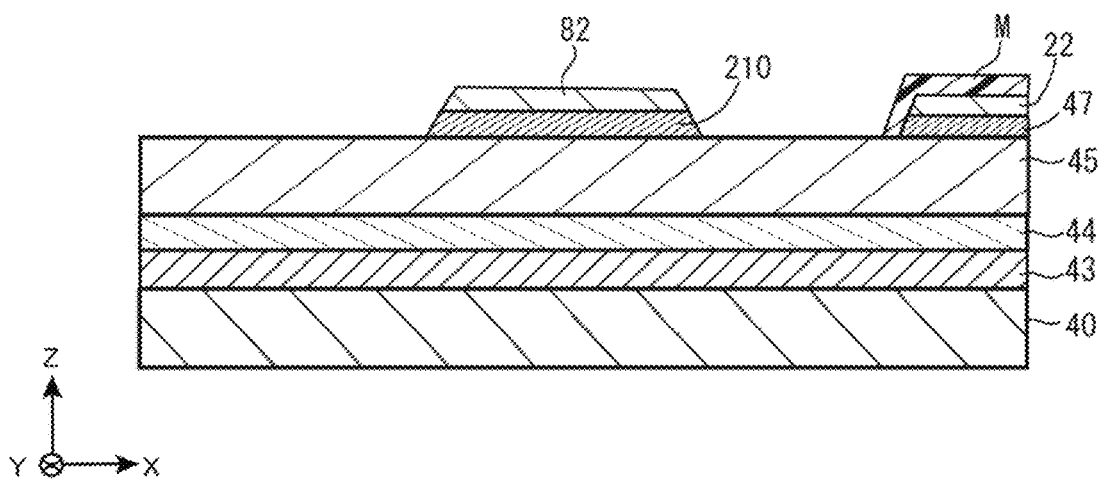
FIG. 9B is a cross-sectional view illustrating a step of forming a mask on a signal line illustrated in FIG. 9 A.
Figure 9C:
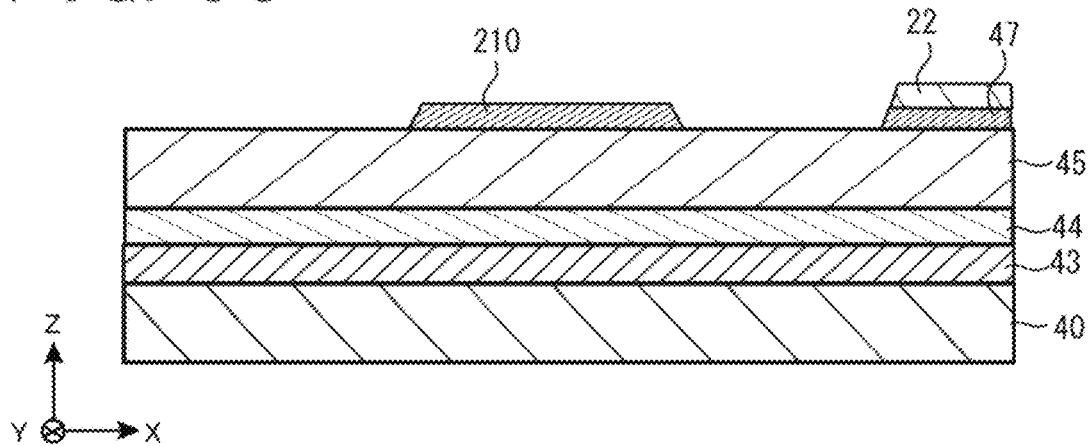
FIG. 9C is a cross-sectional view illustrating a step of exposing a surface of the auxiliary counter electrode, and removing the mask, subsequent to the state illustrated in FIG. 9B.

Thereafter, in the area where the metal film 82 is formed, on parts of the metal film 82 that is formed as the signal lines 22, a mask M is made of photoresist (see FIG. 9B). Then, the parts of the metal film 82 not covered with the mask M are removed by wet etching. This causes surfaces of the auxiliary counter electrodes 210 to be exposed (see FIG. 9O).

After the signal lines 22 are formed, the same steps as those illustrated in FIGS. 5E to 5L in Embodiment 1 are executed, whereby the active matrix substrate 1A is formed.

Examples of the touch-panel-equipped display device according to the present invention are described above, but the touch-panel-equipped display device according to the present invention is not limited to the configurations of the above-described embodiments, and may have a variety of modified configurations. The modification examples are described below.

Modification Example 1

In the above-described embodiments and modification examples, an etching stopper layer may be provided between the source electrode 42c and the drain electrode 42d of the TFT 42. This configuration makes it possible to prevent the semiconductor film 42b from being damaged by etching performed when the source electrode 42c, the drain electrode 42d, and the like are formed.

Modification Example 2

Further, the above-described embodiments and modification examples are described with reference to an example in which bottom-gate-type TFTs are used, but the TFTs may be top-gate-type TFTs. Further, the semiconductor film 42b is not limited to the oxide semiconductor film, but may be an amorphous silicon film.

The invention claimed is:

1. A touch-panel-equipped display device comprising an active matrix substrate,
   wherein the active matrix substrate includes:
   a plurality of gate lines;
   a plurality of data lines intersecting with the gate lines;
   a plurality of pixel electrodes;
   a plurality of counter electrodes that form capacitors between the same and the pixel electrodes;
   a plurality of touch detection lines that are connected with any of the counter electrodes, and supply a driving signal for touch detection to the counter electrodes connected therewith;
   a first insulating layer; and
   a second insulating layer,
   wherein the second insulating layer is arranged between each pixel electrode and the corresponding one of the counter electrodes, the first insulating layer is arranged on each touch detection line, the second insulating layer is arranged on the first insulating layer, and each counter electrode is arranged on the second insulating layer,
   the active matrix substrate further includes a plurality of auxiliary counter electrodes that form capacitors between the same and the pixel electrodes,
   the counter electrodes are arranged in matrix, and
   each auxiliary counter electrode is opposed to the corresponding one of the pixel electrodes with the first insulating layer being interposed therebetween, and is arranged approximately in parallel with the data lines.

2. The touch-panel-equipped display device according to claim 1,
   wherein a specific dielectric constant of the first insulating layer and a specific dielectric constant of the second insulating layer are equal to each other, and the first insulating layer has a thickness greater than that of the second insulating layer.

3. The touch-panel-equipped display device according to claim 1,
   wherein the each pixel electrode is provided between the first insulating layer and the second insulating layer.

4. The touch-panel-equipped display device according to claim 1,
   wherein, while the driving signal is being supplied to the touch detection lines, the auxiliary counter electrodes are in an electrically floating state.

5. The touch-panel-equipped display device according to claim 1,
   wherein, to each of the gate lines, a scanning voltage signal is supplied at fixed intervals, and
   periods while the scanning voltage signal is supplied to adjacent ones of the gate lines partially overlap with each other.

6. The touch-panel-equipped display device according to claim 1,
   wherein the active matrix substrate further includes:
   an insulating layer including an organic film, the insulating layer being arranged between at least either the gate lines or the data lines, and at least either the auxiliary capacitance electrodes or the counter electrodes.

7. The touch-panel-equipped display device according to claim 1,
   wherein the auxiliary counter electrodes are provided so that each of the auxiliary counter electrode is opposed to at least two of the counter electrodes.

* * * * *